US012727403B2

(12) United States Patent
Razeghi

(10) Patent No.: US 12,727,403 B2
(45) Date of Patent: Sep. 1, 2026

(54) METHODS FOR FORMING K-PHASE GALLIUM OXIDE MATERIALS

(71) Applicant: Northwestern University, Evanston, IL (US)

(72) Inventor: Manijeh Razeghi, Wilmette, IL (US)

(73) Assignee: Northwestern University, Evanston, IL (US)

( * ) Notice: Subject to any disclaimer, the term of this patent is extended or adjusted under 35 U.S.C. 154(b) by 471 days.

(21) Appl. No.: 18/277,269

(22) PCT Filed: Feb. 11, 2022

(86) PCT No.: PCT/US2022/016056
§ 371 (c)(1),
(2) Date: Aug. 15, 2023

(87) PCT Pub. No.: WO2022/182531
PCT Pub. Date: Sep. 1, 2022

(65) Prior Publication Data

US 2024/0096618 A1 Mar. 21, 2024

Related U.S. Application Data

(60) Provisional application No. 63/232,344, filed on Aug. 12, 2021, provisional application No. 63/151,113, filed on Feb. 19, 2021.

(51) Int. Cl.
*H01L 21/02* (2006.01)
*C23C 16/40* (2006.01)
(Continued)

(52) U.S. Cl.
CPC .......... *H10P 14/3434* (2026.01); *C23C 16/40* (2013.01); *H10D 62/80* (2025.01); *H10P 14/24* (2026.01)

(58) Field of Classification Search
None
See application file for complete search history.

(56) References Cited

U.S. PATENT DOCUMENTS

| | | | |
|---|---|---|---|
| 3,600,240 | A | 8/1971 | Rupprecht et al. |
| 3,676,228 | A | 7/1972 | Sakurai et al. |

(Continued)

FOREIGN PATENT DOCUMENTS

| | | | | |
|---|---|---|---|---|
| EP | 0090521 A2 | 3/1982 | | |
| WO | WO-2019147602 A1 * | 8/2019 | ............. | H10D 62/80 |

OTHER PUBLICATIONS

The International Search Report and the Written Opinion issued on Sep. 6, 2022 for international patent application No. PCT/US2022/016056; pp. 1-9.

(Continued)

*Primary Examiner* — Alexander M Weddle
(74) *Attorney, Agent, or Firm* — Bell & Manning, LLC

(57) ABSTRACT

Methods of forming κ-phase gallium oxide materials are provided, including highly conductive and highly phase stable such materials. In embodiments, the method comprises exposing a surface of a substrate positioned in a metalorganic chemical vapor deposition (MOCVD) reactor to a gallium (Ga) precursor vapor, an indium (In) precursor vapor, an oxygen (O) precursor vapor, and a silicon (Si) precursor vapor, under conditions to form a κ-phase gallium oxide material on the surface of the substrate. The κ-phase gallium oxide material comprises Ga, O, Si, and further comprises no more than 0.1 weight % In.

19 Claims, 6 Drawing Sheets

(51) Int. Cl.

| | |
|---|---|
| ***H01L 29/24*** | (2006.01) |
| ***H10D 62/80*** | (2025.01) |
| ***H10P 14/20*** | (2026.01) |
| ***H10P 14/24*** | (2026.01) |

(56) References Cited

U.S. PATENT DOCUMENTS

| | | | | |
|---|---|---|---|---|
| 4,035,205 | A | 7/1977 | Lebailly et al. | |
| 4,583,110 | A | 4/1986 | Jackson et al. | |
| 4,692,194 | A | 9/1987 | Nishizawa | |
| 4,939,102 | A | 7/1990 | Hamm et al. | |
| 5,268,582 | A | 12/1993 | Kopf et al. | |
| 2008/0038906 | A1 | 2/2008 | Ichinose et al. | |
| 2010/0065855 | A1 | 3/2010 | Yokoyama et al. | |
| 2011/0186856 | A1 | 8/2011 | Huang et al. | |
| 2012/0267234 | A1 | 10/2012 | Reece | |
| 2014/0183598 | A1 | 7/2014 | Chiu et al. | |
| 2014/0210835 | A1* | 7/2014 | Hong | H10D 84/038<br>345/530 |
| 2014/0374765 | A1 | 12/2014 | Curatola | |
| 2018/0254355 | A1 | 9/2018 | Sasaki | |
| 2018/0308996 | A1 | 10/2018 | Park | |
| 2019/0006472 | A1 | 1/2019 | Matsuda et al. | |
| 2019/0115434 | A1* | 4/2019 | Sakumoto | H10D 30/63 |
| 2020/0350166 | A1* | 11/2020 | Hosseini Teherani | H01L 21/02565 |
| 2021/0074837 | A1 | 3/2021 | Hao | |
| 2023/0411314 | A1 | 12/2023 | Saunier et al. | |

OTHER PUBLICATIONS

Lee et al., Highly Conductive Co-Doped Ga2O3: Si—In Grown by MOCVD, *Coatings*, vol. 11, No. 287, Mar. 2, 2021 [retrieved on Jul. 15, 2022]. Retrieved from the internet, URL: https://www.mdpi.com/2079-6412/11/3/287.; pp. 1-7.

Lee et al., High Thermal Stability of k-Ga2O3 Grown by MOCVD, *Crystals*, vol. 11, No. 446, Apr. 20, 2021 [retrieved on Jul. 15, 2022]. Retrieved from the internet, URL: https://www.mdpi.com/2073-4352/11/4/446/htm>. pp. 1-5.

Manijeh Razeghi et al., "A review of the growth, doping, and applications of β-Ga2O3 thin films," Proc. of SPIE vol. 10533, pp. 105330R-1-105330R-24.

Michael A. Mastro et al., "Opportunities and Future Directions for Ga2O3," ECS Journal of Solid State Science and Technology, vol. 6, No. 5, 2017, pp. P356-P359.

Kalpana Singh et al., "Amphoteric oxide semiconductors for energy conversion devices: a tutorial review," Chem. Soc. Rev., vol. 42, 2013, pp. 1961-1972.

Junhee Lee et al., "Study of Phase Transition in MOCVD Grown Ga2O3 from K to B Phase by Ex Situ and In Situ Annealing," *Photonics* 2021, 8, 17; pp. 1-8. https://doi.org/10.3390/photonics8010017.

Yingda Chen et al., "High hole concentration in p-type AlGaN by indium-surfactant-assisted Mg-delta doping," *Appl. Phys. Lett.* 106, 162102 (Apr. 22, 2015); https://doi.org/10.1063/1.4919005.

Erin C. H. Kyle et al., "Increased p-type conductivity through use of an indium surfactant in the growth of Mg-doped GaN," *Applied Physics Letters* 106, 222103 (2015), https://doi.org/10.1063/1.4922216.

Takashi Aisaka et al., "Improvement of surface morphology of nitrogen-polar GaN by introducing indium surfactant during MOVPE growth," *Japanese Journal of Applied Physics* 53, 085501-085501-4 (2014). https://dx.doi.org/10.7567/JJAP.53.085501.

Manijeh Razeghi et al., "Review of III-nitride optoelectronic materials for light emission and detection," *Phys. Stat. Sol.* (c) 1, No. S2, S141-S148 (2004) DOI 10.1002/pssc.200405133.

S. Keller et al., "Indium-surfactant-assisted growth of high-mobility AlN/GaN multilayer structures by metalorganic chemical vapor deposition," *Appl. Phys. Lett.* 79, 3449 (2001); https://doi.org/10.1063/1.1420573.

R. McClintock et al., "High quantum efficiency AlGaN solar-blind p-i-n photodiodes," Appl. Phys. Lett. 84, 1248 (2004); https:/doi.org/10.1063/1.1650550.

Haiding Sun et al., "Valence and conduction band offsets of Beta-Ga2O3/AlN heterojunction, "Appl. Phys. Lett. 111, 162105-1 to 162105-5 (2017); pp. 1-6.

* cited by examiner

METHODS FOR FORMING K-PHASE GALLIUM OXIDE MATERIALS

CROSS-REFERENCE TO RELATED APPLICATIONS

The present application is a National Stage of International Application No. PCT/US22/16056, filed Feb. 11, 2022, which claims priority to U.S. provisional patent application No. 63/151,113 that was filed Feb. 19, 2021 and to U.S. provisional patent application No. 63/232,344 that was filed Aug. 12, 2021, the entire contents of each of which are incorporated herein by reference.

REFERENCE TO GOVERNMENT RIGHTS

This invention was made with government support under grant number FA9550-19-1-0410 awarded by the Air Force Office of Scientific Research (AFOSR). The government has certain rights in the invention.

BACKGROUND

Gallium oxide ($Ga_2O_3$) has drawn much attention due to its potential for realizing next generation ultra-wide band gap (UWBG) electronic/optoelectronic device applications such as high-power transistors or UV solar blind photodetectors (SBPD). Of five different polymorphic forms (α-, β-, γ-, δ-, and κ), single crystal β-$Ga_2O_3$ exhibits a relatively high breakdown voltage compared with those of other wide bandgap materials, such as GaN or SiC. There has been interest in utilizing β-$Ga_2O_3$ in many important technological applications from transparent electrodes, thin film transistors and gas sensors to solar blind photodetectors and LEDs emitting in UVC band. Although other polymorphic forms of $Ga_2O_3$ could be considered for use in device applications, achieving sufficiently conductive materials is a challenge that has not yet been addressed. For example, a conductive metastable ε-$Ga_2O_3$ has been grown by metalorganic chemical vapor deposition (MOCVD), but the reported electron hall mobility at room temperature was in the range of only 1-5 $cm^2$/V-s with an electron concentration of about $3 \cdot 10^{18}$ $cm^{-3}$. (Parisini, A., et al., *APL Materials,* 2019, 7(3), p 0.031114.)

SUMMARY

Disclosed are methods of forming κ-phase gallium oxide materials. The resulting κ-phase gallium oxide materials are also provided. Embodiments of the methods are able to provide a κ-phase gallium oxide material comprising silicon (Si) and no more than about 0.1 weight % indium (In) that has an electron hall mobility of about 150 $cm^2$/Vs at room temperature and carrier concentration of about $2 \cdot 10^{17}$ $cm^{-3}$. Such high conductivity combined with the κ-phase morphology (associated with a wide band gap energy and large spontaneous polarization value) renders this gallium oxide material extremely useful for a variety of high-performance electronic/optoelectronic devices.

In embodiments, a method of forming a κ-phase gallium oxide material comprises exposing a surface of a substrate positioned in a metalorganic chemical vapor deposition (MOCVD) reactor to a gallium (Ga) precursor vapor, an indium (In) precursor vapor, an oxygen (O) precursor vapor, and a silicon (Si) precursor vapor, under conditions to form a κ-phase gallium oxide material on the surface of the substrate. The κ-phase gallium oxide material comprises Ga, O, Si, and further comprises no more than 0.1 weight % In.

κ-phase gallium oxide materials comprising Ga, O, Si, and further comprising no more than 0.1 weight % In are also provided, including highly conductive such materials and highly phase stable such materials.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

DETAILED DESCRIPTION

Figure 1B:
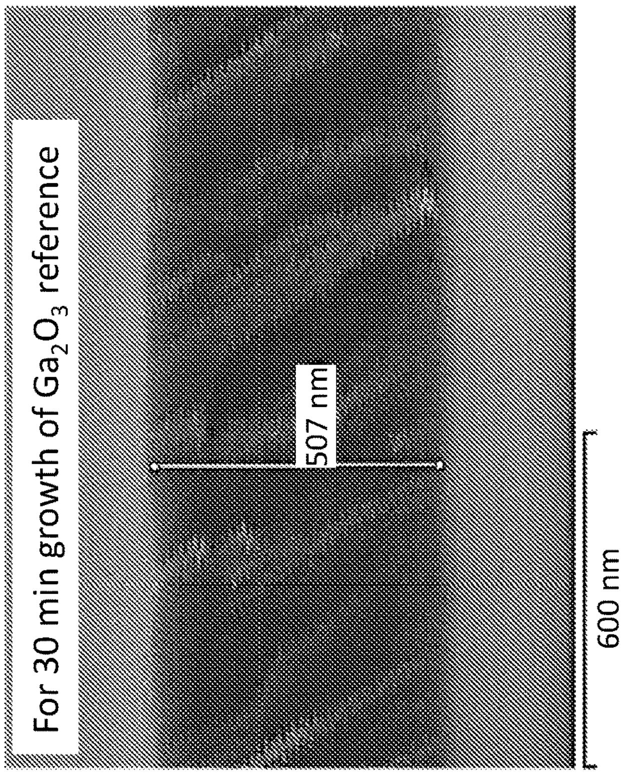
FIG. 1B shows a cross-sectional scanning electron microscope (SEM) image of the $Ga_2O_3$ reference sample (Structure 1).
Figure 1A:
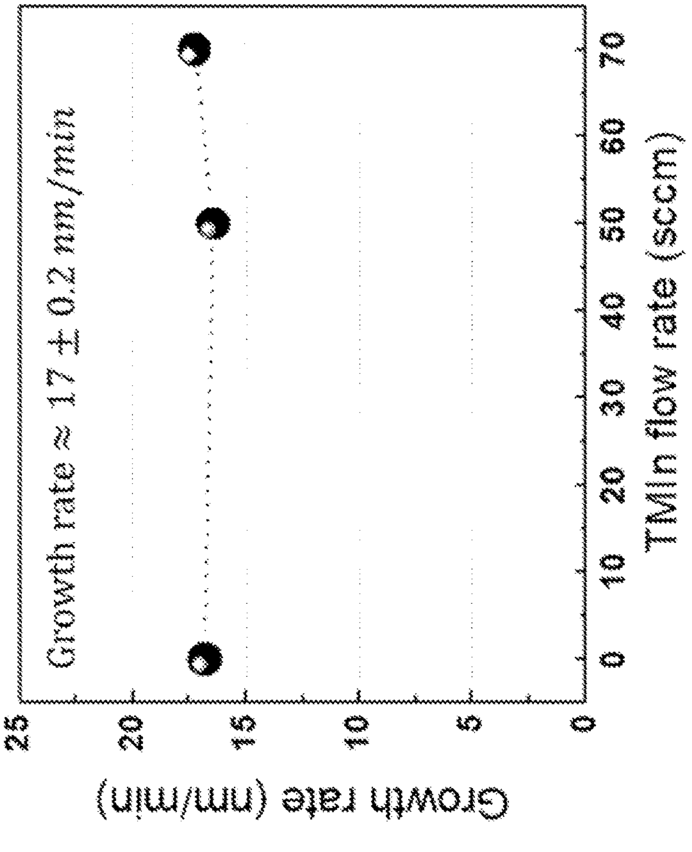
FIG. 1A is a plot of growth rate versus the flow rate of the In precursor vapor (trimethylindium, TMIn).

The present methods are based on the technique of MOCVD and thus, may be carried out in any reactor system suitable for MOCVD. The methods comprise exposing a surface of a substrate positioned in a MOCVD reactor to various precursors under conditions which allow for the formation of a κ-phase gallium oxide compound semiconductor, including any of the κ-phase gallium oxide materials described herein.

The precursors used in the present methods comprise a gallium (Ga) precursor, an indium (In) precursor, an oxygen (O) precursor, and a silicon (Si) precursor. The Ga and In precursors are metalorganic compounds. A variety of Ga precursors may be used, e.g., trimethylgallium, triethylgallium, triisopropylgallium, and triisobutylgallium. A single type of Ga precursor may be used or combinations of different types. Similarly, a variety of In precursors may be used, e.g., trimethylindium, triethylindium, and triisopropylindium. A single type of In precursor may be used or combinations of different types. The O precursor is a compound comprising oxygen. A variety of O precursors may be used, e.g., water, oxygen, $N_2O$, and ozone. A single type of O precursor may be used or combinations of different types. The Si precursor is a compound comprising silicon. A variety of Si precursors may be used, e.g., $SiH_4$, tetraethylorthosilicate, $Si_2H_6$, and $SiCl_4$. A single type of Si precursor may be used or combinations of different types. In embodiments, the only precursors used in the methods are the Ga precursor, the O precursor, the Si precursor, and the In precursor; i.e., others are not used.

The precursors may be provided as a vapor which may further comprise a carrier gas. Various carrier gases may be used, e.g., $N_2$, Ar, and $H_2$. A single type of carrier gas or combinations of different types of carrier gases may be used. However, in embodiments, the carrier gas is $H_2$. As shown in Example 1, it has been found that use of $H_2$ as a carrier gas provides a κ-phase gallium oxide material that has an unexpectedly high electron Hall mobility at room temperature (see Structure 3 of Tables 1 and 2). In other embodiments, the carrier gas is $N_2$. As shown in Example 3, it has been found that the use of $N_2$ as a carrier gas unexpectedly improves the stability of the κ-phase gallium oxide material such that the κ-phase is maintained even upon post-growth annealing.

The exposure of the substrate to any particular precursor may be carried out by delivering the vapor comprising the precursor, and if used, the carrier gas, to the MOCVD reactor comprising the substrate. Each precursor vapor may be delivered to the MOCVD reactor separately and independently from the other precursor vapors. A precursor vapor may be delivered as a continuous flow or a pulsed flow. A precursor vapor may be delivered together (combined) with one or more other precursor vapors or alternating with one or more other precursor vapors. The delivery of each precursor vapor may be further characterized by a flow rate and a flow time. Delivery may be further described in terms of flow rate ratios, the ratio of the flow rate of one precursor vapor to the flow rate of another precursor vapor. Flow time refers to the total time of flowing for a continuously flowed precursor vapor or the length of a pulse for a pulsed flow of precursor vapor. Pulsed precursor vapors may be further characterized by a repetition rate, i.e., number of pulses, used during the method. Each of the vapor flow characteristics described herein may be independently selected for each precursor vapor used during the method, including a selection to achieve any of the κ-phase gallium oxide materials described herein. Illustrative values are provided below, as well as the Examples.

In addition to the vapor flow characteristics described above, other conditions being used in the present methods include the substrate surface temperature and the pressure of the vapor (generated by the precursors and carrier gas(es)) over the substrate surface. These conditions may also be selected to achieve any of the κ-phase gallium oxide materials described herein. Illustrative values are provided below, as well as the Examples.

In embodiments, exposure of the substrate surface to the precursors comprises alternating delivery of the Ga precursor vapor with delivery of the In precursor vapor. In such embodiments, no In precursor vapor is delivered when the Ga precursor vapor is delivered and vice versa. (See Structures 2 and 3 in Table 1.) In any of the embodiments described in this paragraph, the alternating step may be carried out once or more than one time, e.g., (a) delivering the Ga precursor vapor, (b) delivering the In precursor vapor, and (c) repeating (a) and (b) one or more times. Any of the embodiments described in this paragraph may be accomplished by using a pulsed Ga precursor vapor and a pulsed In precursor vapor.

In embodiments, exposure of the substrate surface to the precursors comprises alternating delivery of the Ga precursor vapor with a combined delivery of both the Ga precursor vapor and the In precursor vapor. In such embodiments, no In precursor vapor is delivered with the initial delivery of the Ga precursor vapor. (See Structure 4 in Table 1.) In any of the embodiments described in this paragraph, the alternating step may be carried out once or more than one time, e.g., (a) delivering the Ga precursor vapor, (b) delivering both the In precursor vapor and the Ga precursor vapor, and (c) repeating (a) and (b) one or more times. Any of the embodiments described in this paragraph may be accomplished by using a pulsed Ga precursor vapor and a pulsed In precursor vapor.

In embodiments, including in any of the embodiments described above, exposure of the substrate surface to the precursors comprises delivering the O precursor vapor along with the Ga precursor vapor, along with the In precursor vapor, or both. This may be accomplished by using a continuous flow of the O precursor vapor.

In embodiments, including in any of the embodiments described above, exposure of the substrate surface to the precursors comprises delivering the Si precursor vapor along with the Ga precursor vapor, along with the In precursor vapor, along with the O precursor vapor, or combinations thereof. This may be accomplished by using a continuous flow of the Si precursor vapor.

With reference back to precursor vapor flow characteristics and other conditions of the present methods, in embodiments, a flow rate ratio of the In precursor vapor flow rate to the Ga precursor vapor flow rate of at least 12 is used. This includes a flow rate ratio of at least 14, at least 18 or in a range of from 12 to 18. In embodiments, the substrate surface temperature is in the range of from 500° C. to 1500° C. This includes from 500° C. to 1000° C. and from 500° C. to 800° C. In embodiments, the vapor pressure over the substrate surface is in the range of from 10 mbar to 100 mbar. This includes from 50 mbar to 150 mbar.

A variety of substrates may be used in the present methods, e.g., sapphire (a-sapphire, m-sapphire, c-sapphire), $Al_2O_3$, silicon (Si(111), Si(100)), native β-$Ga_2O_3$, MgO, ZnO, etc.

The present methods may further comprise forming other material layers before, or after, forming the desired κ-phase gallium oxide material. These other material layers depend upon the desired application, but may include other semiconductors, including semiconductors of a carrier type opposite (e.g., p-type) to that of the κ-phase gallium oxide material.

It is noted that although In has been used in the formation of other types of compound semiconductors (e.g., Ga nitride semiconductors) using other methods, it is not possible to predict effects when changing material systems, i.e., nitrogen is a group V element whereas oxygen is a group VI element. Moreover, the increased room temperature electron hall mobilities and phase stability demonstrated herein are significantly beyond that observed in Ga nitride material systems.

The κ-phase gallium oxide materials formed using the present methods are also provided. The existence of the κ-phase may be confirmed using XRD as described in the Examples below. By "gallium oxide" it is meant a compound of $Ga_2O_3$. However, due to the use of the Si precursor, an amount of Si is present, i.e., is incorporated into the solid matrix of $Ga_2O_3$. Although the In precursor is also used, as demonstrated in the Examples below, an amount of In may be present, but not more than 0.1 weight % as compared to the weight of the $Ga_2O_3$ formed. The amount of In may be not more than 0.01 weight %, not more than 0.001%, or zero. In embodiments, an amount of In is present, but not more than 0.1 weight %. The amounts may be quantified using EDS analysis as described in Example 1, below. In embodiments, the only elements present in the κ-phase gallium oxide material are Ga, O, Si, and optionally, In; that is, the κ-phase gallium oxide material consists of Ga, O, Si, and optionally, In. In embodiments, the In is present, but not more than at 0.1 weight %. These embodiments, however, do not preclude the presence of impurities normally associated with the precursors used and the MOCVD process.

κ-phase gallium oxide materials which have been formed using alternating delivery of precursor vapors (e.g., alternating delivery of the Ga precursor vapor with delivery of the In precursor vapor) may be referred to as superlattice structures. This is because such alternating delivery generally forms the material in a layer-by-layer process to build up a multilayer structure. This term may be used even though no distinct $In_2O_3$ layer may be formed in the κ-phase gallium oxide material.

The κ-phase gallium oxide materials may be characterized by their electron Hall mobility at room temperature. In embodiments, this Hall mobility may be at least 100 $cm^2$/Vs, at least at least 125 $cm^2$/Vs, at least 150 at least 100 $cm^2$/Vs, or in a range of from 1 $cm^2$/Vs to 10 $cm^2$/Vs, from 10 $cm^2$/Vs to 200 $cm^2$/Vs, from 100 $cm^2$/Vs to 300 $cm^2$/Vs, or from 100 $cm^2$/Vs to 200 $cm^2$/Vs. Known techniques may be used to measure electron Hall mobility. The measured electron Hall mobility values may refer to the as-grown κ-phase gallium oxide material (e.g., prior to post growth annealing).

The κ-phase gallium oxide materials may be characterized by their carrier concentrations at room temperature. The κ-phase gallium oxide material may be n-type. In embodiments, the carrier concentration at room temperature is at least $10^{16}$ $cm^{-3}$, at least $10^{17}$ $cm^{-3}$, at least $10^{18}$ $cm^{-3}$ or in a range of from $10^{16}$ $cm^{-3}$ to $10^{18}$ $cm^{-3}$. Known techniques may be used to measure carrier concentration. The measured carrier concentrations may refer to the as-grown κ-phase gallium oxide material (e.g., prior to post growth annealing).

As noted above, the phase of the present gallium oxide materials is κ-phase. However, in embodiments, the material is further characterized as maintaining the κ-phase even after post-growth annealing. The post-growth annealing may refer to annealing at a temperature of about 1000° C., using either in situ annealing within the MOCVD system or ex situ rapid thermal annealing.

Also encompassed by the present disclosure are p-n heterojunctions formed from any of the disclosed κ-phase gallium oxide materials. Such heterojunctions comprise the κ-phase gallium oxide material and a semiconductor of opposite carrier type (e.g., p-type) in contact with the κ-phase gallium oxide material.

Devices incorporating the κ-phase gallium oxide materials are also provided. Illustrative devices include photodetectors (including solar-blind UV photodetectors), field effect transistors, light emitting diodes and combinations thereof. Such devices may comprise the κ-phase gallium oxide material and another material layer in contact with the κ-phase gallium oxide material, selection of which depends upon the desired device and application.

EXAMPLES

Example 1

This Example demonstrates a highly conductive co-doped $Ga_2O_3$:Si-In with a high electron mobility up to ~150 $cm^2$/V-s at room temperature grown by MOCVD on c-plane sapphire substrate, with carrier concentration of $2\cdot10^{17}$ $cm^{-3}$.

Materials and Methods

Different superlattice structures were grown, consisting of oxide layers with various doping at 690° C. under $H_2$ carrier gas using Trimethyl-gallium (TMGa), Trimethylindium (TMIn), pure $H_2O$ vapor, and Silane ($SiH_4$) as Ga, In, O and Si precursors, respectively, grown by an Aixtron horizontal AIX200/4 MOCVD reactor. Detailed information about the different structures grown is summarized in Table 1.

TABLE 1

Structures Grown. Flow rates in sccm are provided for each of the precursors (Ga, In, $H_2O$, Si).

| | Type of Structure | Ga | In | $H_2O$ | Si |
|---|---|---|---|---|---|
| Structure 1 | $Ga_2O_3$ (Reference) | 5 | 0 | 1600 | 20 |
| Structure 2 | $Ga_2O_3$ (30 sec)/$In_2O_3$ (1 min) | 5 | 50 | 1600 | 20 |
| Structure 3 | $Ga_2O_3$ (30 sec)/$In_2O_3$ (1 min) | 5 | 70 | 1600 | 20 |
| Structure 4 | $Ga_2O_3$ (1 min)/$(In_xGa_{1-x})_2O_3$ (1 min) | 5 | 70 | 1600 | 20 |

Results and Discussion

Several characterizations were performed for the samples listed in Table 1. At first, using a scanning electron microscope (SEM), the total thickness of the structures was measured. All of the deposited superlattice layers had an equivalent growth rate regardless of the TMIn flow rate during the growth. For example, the reference sample $Ga_2O_3$:Si (Structure 1) was deposited with a rate of 16.8 nm/min while that of $Ga_2O_3$:Si/$(In_xGa_{1-x})_2O_3$:Si (Structure 4) was 17.2 nm/min, showing an error range of 0.2 nm/min. This indicates that $In_2O_3$ was not formed, or the growth of $In_2O_3$ was formed in a non-layer-by-layer fashion.

Figure 2A:
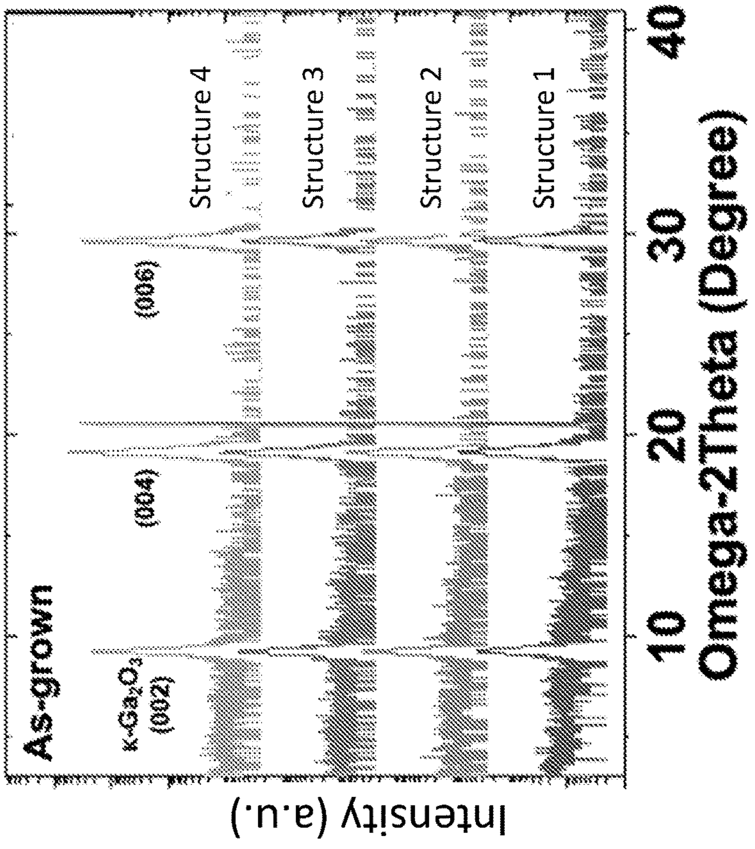
FIGS. 2A-2B show X-ray diffraction (XRD) patterns from the various (FIG. 2A) as-grown structures and (FIG. 2B) the annealed samples of Table 1.
Figure 2B:
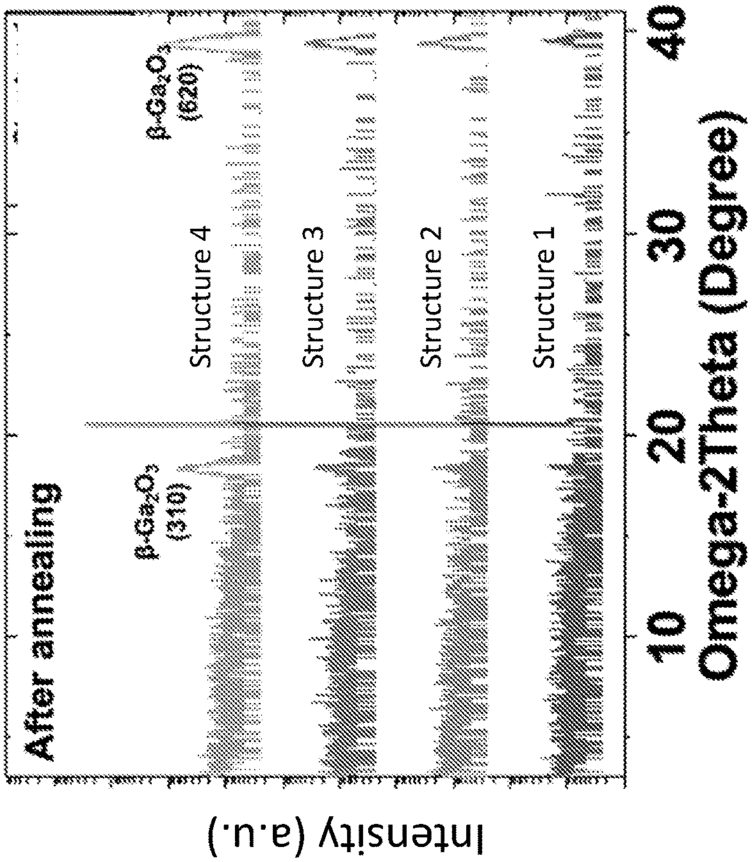

The XRD patterns shown in FIGS. 2A-2B also support the fact that indium was not formed as a layer. All the as-grown samples exhibit the same peak positions corresponding to κ-$Ga_2O_3$ (002), (004), and (006) reflections. Neither superlattice satellite peaks nor peak position shifts were observed from the superlattice structures in spite of the fact that TMIn was supplied during the growth. This result indicates that the incorporated indium is small enough not to cause a change in the out of plane lattice parameter. These samples also showed the evidence of phase transition from κ- to β-phase upon annealing at 1000° C. Although a phase transition occurred after the annealing process, no evidence of the peak shifts in either (310) or (620) peaks were observed. If $In_2O_3$ was grown and subsequent indium diffusion happened after the annealing at 1000° C., one would expect to observe peak shift in (310) and (620) peaks as the diffused indium atoms will replace Ga atoms and the lattice parameter should subsequently change, which was not observed. This observation suggests that the indium was incorporated in a small degree since substantial indium incorporation should result in a higher growth rate as a result of increased group III molar flow rate or cause peak shifts in the XRD data.

Figure 3:
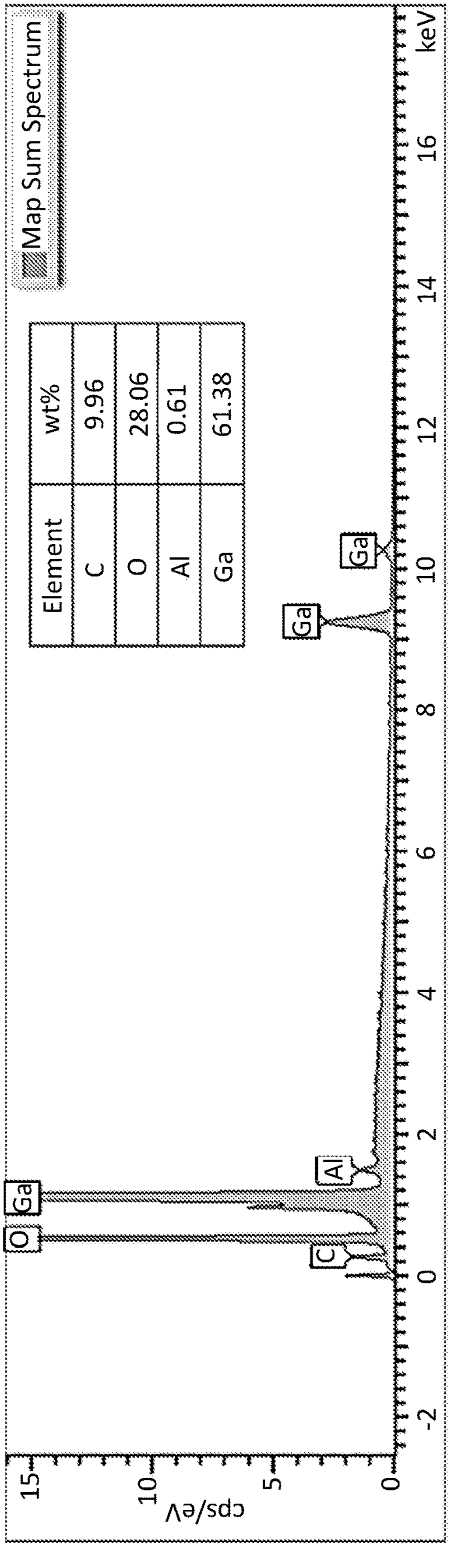
FIG. 3 shows energy dispersive X-ray spectroscopy (EDS) analysis performed from the as-grown superlattice structure using 70 sccm of TMIn (Structure 3).

In order to further investigate the indium incorporation in the superlattice structures, energy-dispersive X-ray spectroscopy (EDS) taken along with scanning transmission electron microscopic (STEM) analysis was carried out for the superlattice sample grown with 70 sccm of TMIn flow rate (Structure 3). As shown in FIG. 3, no evidence of an indium containing nanostructure was observed within its detection limit (0.1 wt %), which is in line with the identical multiple peaks in the XRD patterns as well as the nearly constant growth rate. Therefore, based on the aforementioned characterization data, it was confirmed that no significant amount of indium incorporation was found in any of the superlattice structures.

Although the indium was not incorporated within the superlattice structures, remarkable improvement was found in the electrical characteristics of the samples. Table 2 summarizes the electrical performance measured from all different types of samples (from Structure 1 to Structure 4). In contrast to the electrically resistive as-grown κ-$Ga_2O_3$:Si (ρ>2000 Ω-cm) (Structure 1), the as-grown superlattice structures (Structure 2, 3, 4) exhibited high conductivity with resistivity as low as ρ=0.69 Ω-cm. Moreover, a remarkably high hall mobility of 150 $cm^2/Vs$ was obtained from the superlattice structure grown with 70 sccm of TMIn (Structure 3). This is higher by several times than the any other values measured from other structures. Moreover, the superlattice structures (Structure 2 and Structure 3) exhibited generally higher electron mobilities by a factor of 3 to 15, in comparison to the values obtained from the other superlattice structure (Structure 4), with the electron concentration ranging from $2\cdot10^{17}$ $cm^{-3}$ to $1.3\cdot10^{18}$ $cm^{-3}$. It is also noted that all of the superlattice structures grown without silane as a dopant resulted in a high resistivity before (>11800 Ω-cm) and even after annealing (>9050 Ω-cm).

TABLE 2

Summary of the hall measurement data performed for the structures of Table 1.

| | Before Annealing Process | | After Annealing Process | |
|---|---|---|---|---|
| | Hall mobility | Carrier concentration | Hall mobility | Carrier concentration |
| Structure 1 | Not measurable | Not measurable | 14 $cm^2/Vs$ | $2 \times 10^{18}$ $cm^{-3}$ |
| Structure 2 | 30 $cm^2/Vs$ | $1.3 \times 10^{18}$ $cm^{-3}$ | 27.6 $cm^2/Vs$ | $1.35 \times 10^{19}$ $cm^{-3}$ |
| Structure 3 | 150 $cm^2/Vs$ | $2 \times 10^{17}$ $cm^{-3}$ | 13.8 $cm^2/Vs$ | $2 \times 10^{19}$ $cm^{-3}$ |
| Structure 4 | 10 $cm^2/Vs$ | $9.26 \times 10^{17}$ $cm^{-3}$ | 29 $cm^2/Vs$ | $3 \times 10^{18}$ $cm^{-3}$ |

Figure 4A:
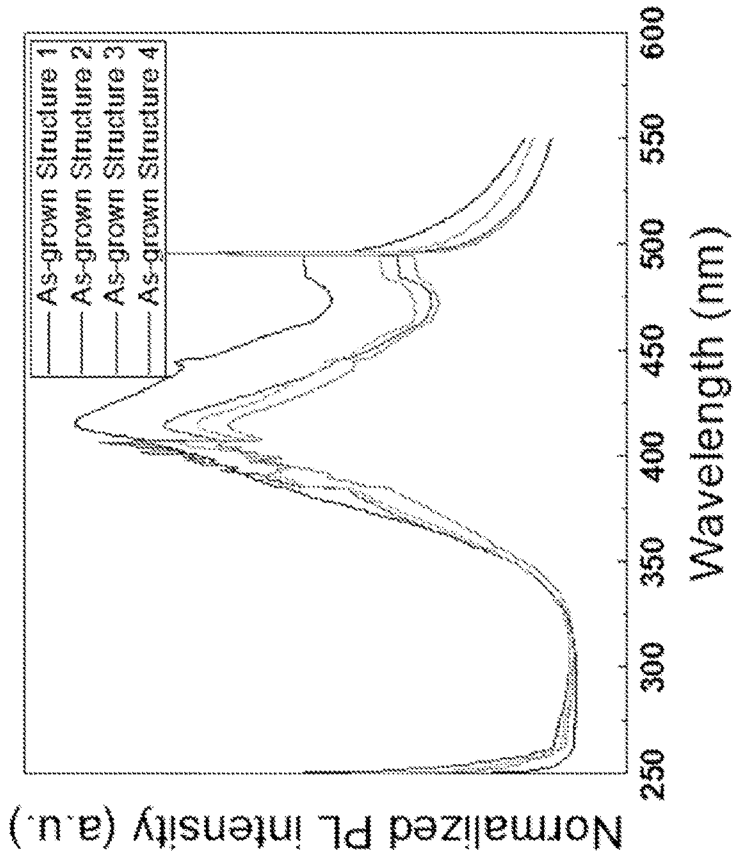
FIGS. 4A-4B show photoluminescence spectra from all of the (FIG. 4A) as-grown and (FIG. 4B) annealed structures.
Figure 4B:
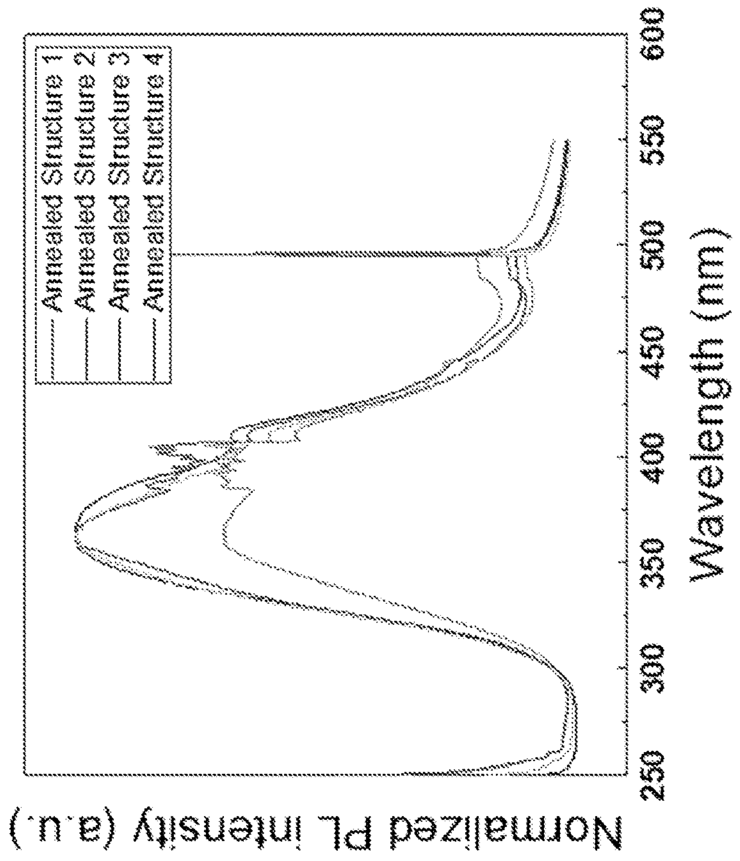
Figure 4C:
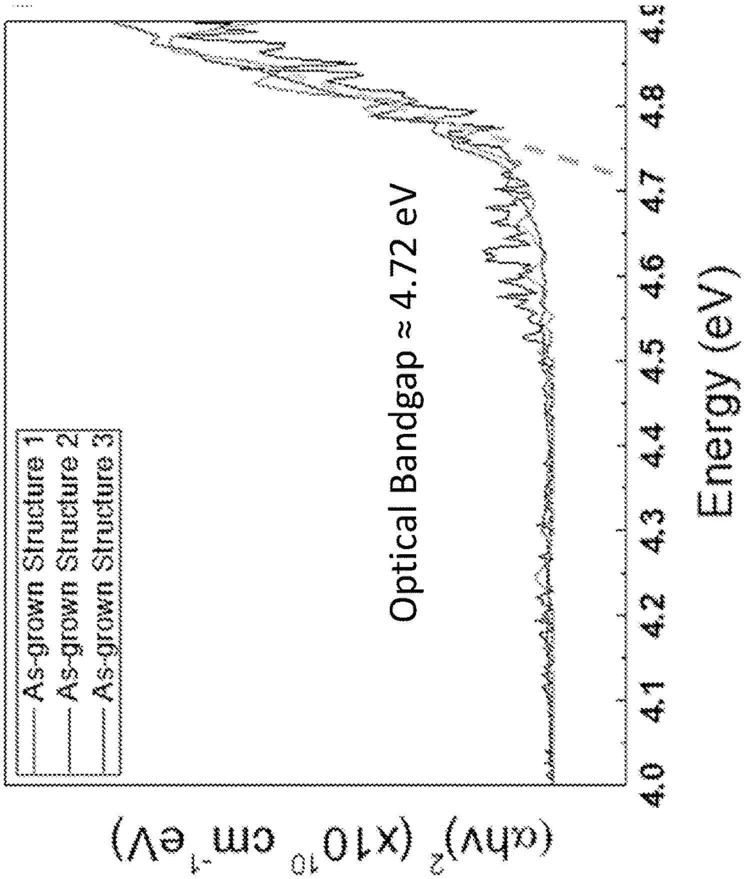
FIGS. 4C-4D show transmission measurements of (FIG. 4C) as-grown and (FIG. 4D) annealed structures for obtaining the optical bandgap.
Figure 4D:
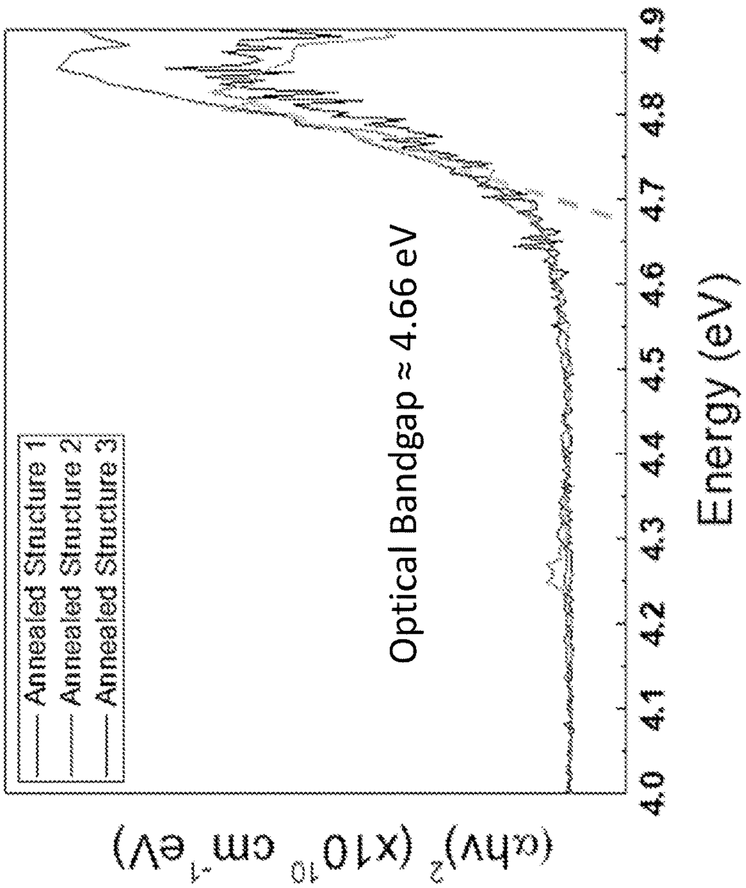

Normalized photoluminescence (PL) spectra were taken from all of the as-grown (FIG. 4A) and annealed (FIG. 4B) samples listed in Table 1. After the annealing process and the subsequent phase transition to (3 phase, the peak position shifted to near 360 nm, which is similar to β-phase $Ga_2O_3$ substrate, while the peak around 420 nm seems to be related to κ phase. Apart from the change in the PL peak, other noticeable traits depending on the amount of TMIn during the growth were not observed, supporting the fact that indium was not deposited.

Transmission measurements were also conducted in order to calculate the optical bandgap of the samples. Evidence was discovered of a decrease in bandgap energy as a result of the phase transition caused by the annealing process at 1000° C. The $(\alpha E)^2$ plots demonstrated that the phase variation from κ- to β-phase led to a decrease in optical energy bandgap for the superlattice structures. Specifically, through a linear fitting, an extracted direct bandgap energy of 4.72 eV for the as-grown samples was measured, whereas the optical bandgap energy of the annealed structures was reduced to 4.66 eV, indicating that the phase transition may have had an influence on the direct bandgap energy. However, similar to the previous observation in PL, regardless of the supply of TMIn during the growth, none of the superlattice samples had different optical characteristics compared to the reference. Therefore, the PL and transmission measurement data suggests that the energy gap of β-phase layers was lower than that of κ-phase $Ga_2O_3$-based material systems.

Conclusions

Highly conductive co-doped $Ga_2O_3$:Si-In films grown on c-plane sapphire substrate were grown with a significantly improved high electron mobility. Structural characterization represented that under $H_2$ conditions as a carrier gas, the samples were grown having a metastable κ-phase, whereas the annealed samples became β-phase in either case, whether doped with silicon or not. When the materials were not doped with silicon, both as-grown and annealed thin films had a high resistivity. Also, even if silicon was added as a dopant during the growth, the as-grown layers still had a high resistivity. On the other hand, when doped with silicon and the TMIn was supplied during the growth, a significantly improved electron hall mobility up to 150 $cm^2/Vs$ was observed in as-grown samples, showing a tendency that a higher flow of TMIn led to an increase in the mobility. Other characterizations such as cross-sectional SEM and EDX analysis indicate that no significant fractional indium incorporation took place. The findings presented in this Example are crucial in realizing high-performance electronic applications where the control of electrical conductivity is important.

Example 2

Figure 5A:
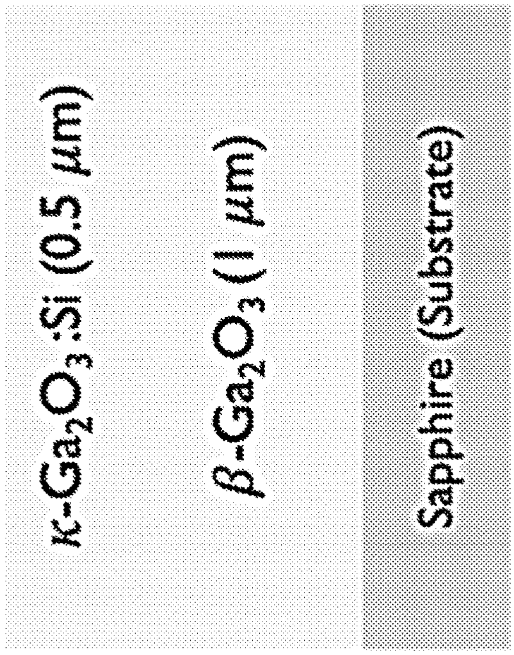
FIG. 5A shows a schematic diagram of the materials grown in another experiment.
Figure 5B:
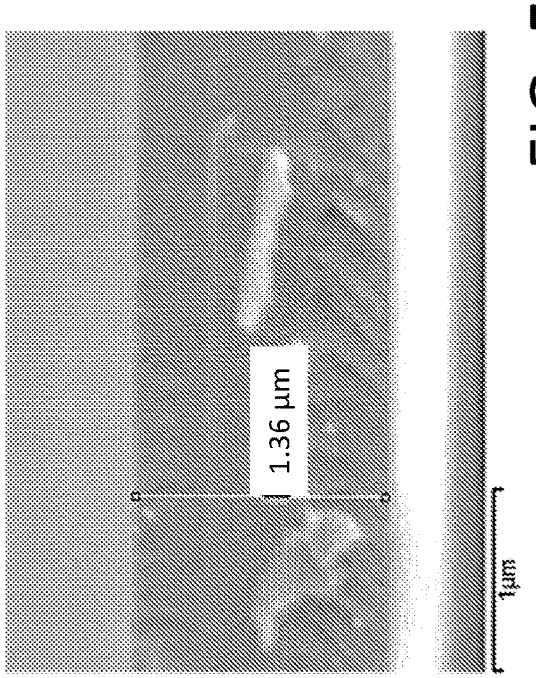
FIG. 5B shows the SEM image of the structure, showing a clear interface between annealed and as-grown $Ga_2O_3$.
Figure 5C:
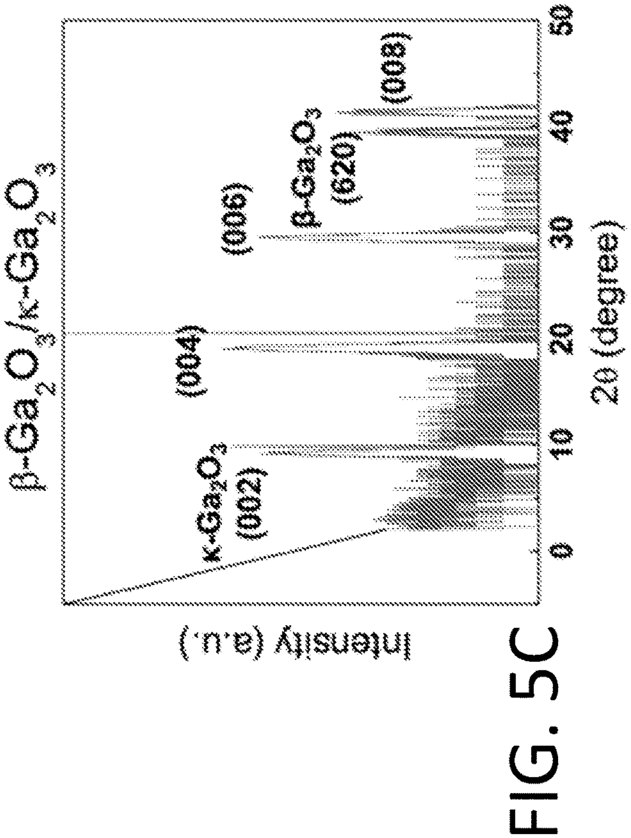
FIG. 5C shows the XRD measurement data, displaying the $Ga_2O_3$ structure with both phases.

As demonstrated in Example 1, as-grown $Ga_2O_3$ has a κ-phase and transits its phase to β-$Ga_2O_3$ when subjected to the annealing process at 1000° C. In this Example, the growth on a β-$Ga_2O_3$ substrate (grown using other methods, not annealed) was compared with the growth on β-$Ga_2O_3$ obtained from annealing a x-$Ga_2O_3$ on sapphire. The results are interesting. As shown in FIGS. 5A-5C, $Ga_2O_3$ grown on annealed β-$Ga_2O_3$ had a κ-$Ga_2O_3$ structure. This is an unexpected outcome. Generally, materials deposited by epitaxial growth will grow with the same orientation as the substrate. Thus, it would have been expected that the $Ga_2O_3$ grown on annealed β-$Ga_2O_3$ would have a phase. Although the β-$Ga_2O_3$ has a crystal orientation of (310), the as-grown $Ga_2O_3$ showed (002) orientation of K-phase, proven by the XRD measurement. Also, it can be easily seen that there is a clear interface between annealed and as-grown layers in the SEM images, indicating that the bottom layer did not have any influence on the next growth since the upper $Ga_2O_3$ did not follow the orientation of the bottom layer. In addition, the materials became relatively more conductive than the $Ga_2O_3$ films under the same conditions without β-$Ga_2O_3$ underneath.

Example 3

In this Example, the experiments of Example 1 were repeated but using $N_2$ as the carrier gas instead of $H_2$. For Structure 3, the room temperature hall mobility and carrier concentration were 2 $cm^2/Vs$ and $2\times10^{17}$ $cm^{-3}$, respectively, for the as-grown structure and 4 $cm^2/Vs$ and $4\times10^{18}$ $cm^{-3}$, respectively, for the annealed structure (1000° C. using either in situ MOCVD annealing or ex situ rapid thermal annealing). Unlike the results of Example 3, however, the phase of the structure did not change to R upon annealing; rather, the κ phase was maintained.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method of forming k-phase gallium oxide material, the method comprising exposing a surface of a substrate positioned in a metalorganic chemical vapor deposition (MOCVD) reactor to a gallium (Ga) precursor vapor, an indium (In) precursor vapor, an oxygen (O) precursor vapor, and a silicon (Si) precursor vapor, under conditions to form a k-phase gallium oxide material on the surface of the substrate, the k-phase gallium oxide material comprising Ga, O, and Si, wherein (i) a spectrum of the κ-phase gallium oxide material obtained using X-ray powder diffraction (XRD) is unchanged as compared to a XRD spectrum of a reference $Ga_2O_3$ material formed using the method but without the In precursor vapor; or (ii) wherein a spectrum of the κ-phase gallium oxide material obtained using energy-dispersive X-ray spectroscopy coupled with scanning transmission electron microscopy shows no evidence of In incorporation; or (iii) both (i) and (ii).

2. The method of claim 1, wherein the exposing comprises alternating delivery of the Ga precursor vapor with the In precursor vapor.

3. The method of claim 2, wherein the exposing further comprises delivering the O precursor vapor along with both the Ga precursor vapor and the In precursor vapor.

4. The method of claim 3, wherein the exposing further comprises delivering the Si precursor vapor along with both the Ga precursor vapor and the In precursor vapor.

5. The method of claim 2, further comprising repeating the alternating delivery of the Ga precursor vapor with the In precursor vapor one or more times.

6. The method of claim 2, wherein $H_2$ is used as a carrier gas in one or more of the Ga precursor vapor, the In precursor vapor, the O precursor vapor, and the Si precursor vapor; and a flow rate ratio of at least 12 is used, the flow rate ratio defined as In precursor vapor flow rate to Ga precursor vapor flow rate.

7. The method of claim 2, wherein $N_2$ is used as a carrier gas in one or more of the Ga precursor vapor, the In precursor vapor, the O precursor vapor, and the Si precursor vapor; and a flow rate ratio of at least 12 is used, the flow rate ratio defined as In precursor vapor flow rate to Ga precursor vapor flow rate.

8. The method of claim 1, wherein the exposing comprises alternating delivery of the Ga precursor vapor with combined delivery of the Ga precursor vapor and the In precursor vapor.

9. The method of claim 8, wherein the exposing further comprises delivering the O precursor vapor along with both the Ga precursor vapor and the combined Ga precursor vapor and the In precursor vapor.

10. The method of claim 9, wherein the exposing further comprises delivering the Si precursor vapor along with both the Ga precursor vapor and the combined Ga precursor vapor and the In precursor vapor.

11. The method of claim 8, further comprising repeating the alternating delivery of the Ga precursor vapor with the combined delivery of the Ga precursor vapor and the In precursor vapor one or more times.

12. The method of claim 1, wherein $H_2$ is used as a carrier gas in one or more of the Ga precursor vapor, the In precursor vapor, the O precursor vapor, and the Si precursor vapor.

13. The method of claim 1, wherein $N_2$ is used as a carrier gas in one or more of the Ga precursor vapor, the In precursor vapor, the O precursor vapor, and the Si precursor vapor.

14. The method of claim 1, wherein a flow rate ratio of at least 12 is used, the flow rate ratio defined as In precursor vapor flow rate to Ga precursor vapor flow rate.

15. The method of claim 1, wherein the κ-phase gallium oxide material consists of Ga, O, and Si.

16. The method of claim 1, wherein the κ-phase gallium oxide material is in the form of a superlattice.

17. The method of claim 1, wherein the κ-phase gallium oxide material has an electron Hall mobility of at least 100 $cm^2/Vs$ at room temperature and a carrier concentration of at least $10^{16}$ $cm^{-3}$ at room temperature.

18. The method of claim 1, wherein the κ-phase gallium oxide material remains κ-phase after annealing at 1000° C.

19. The method of claim 1, wherein the surface of the substrate is $\beta$-$Ga_2O_3$.

* * * * *